United States Patent
Song et al.

(10) Patent No.: US 11,424,307 B2
(45) Date of Patent: Aug. 23, 2022

(54) ORGANIC LIGHT-EMITTING DIODE APPARATUS WITH COLOR FILM SHIELDING LAYER, FABRICATION METHOD THEREOF, DISPLAY PANEL, AND DISPLAY APPARATUS

(71) Applicant: BOE TECHNOLOGY GROUP CO., LTD., Beijing (CN)

(72) Inventors: Zhen Song, Beijing (CN); Guoying Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 745 days.

(21) Appl. No.: 16/333,034

(22) PCT Filed: May 30, 2018

(86) PCT No.: PCT/CN2018/088994
§ 371 (c)(1),
(2) Date: Mar. 13, 2019

(87) PCT Pub. No.: WO2019/114204
PCT Pub. Date: Jun. 20, 2019

(65) Prior Publication Data
US 2021/0376030 A1 Dec. 2, 2021

(30) Foreign Application Priority Data
Dec. 13, 2017 (CN) .......................... 201711326752.7

(51) Int. Cl.
*H01L 27/32* (2006.01)
*H01L 51/56* (2006.01)

(52) U.S. Cl.
CPC ........ *H01L 27/3265* (2013.01); *H01L 27/322* (2013.01); *H01L 27/3246* (2013.01); *H01L 51/56* (2013.01); *H01L 2227/323* (2013.01)

(58) Field of Classification Search
None
See application file for complete search history.

(56) References Cited

U.S. PATENT DOCUMENTS

2014/0159016 A1   6/2014   Song et al.
2016/0064421 A1*  3/2016   Oh ..................... H01L 27/1218
                                                            257/43

(Continued)

FOREIGN PATENT DOCUMENTS

CN     103000661 A     3/2013
CN     202996839 U     6/2013

(Continued)

OTHER PUBLICATIONS

International Search Report dated Sep. 17, 2018, issued in counterpart Application No. PCT/CN2018/088994 (8 pages).

(Continued)

*Primary Examiner* — Nilufa Rahim
(74) *Attorney, Agent, or Firm* — WHDA, LLP

(57) ABSTRACT

The present disclosure is related to an organic light-emitting diode apparatus. The organic light-emitting diode apparatus may include a substrate and a plurality of pixels on a first side of the substrate. Each of the plurality of pixels may include a display region and a non-display region. The non-display region may be provided with a control circuit and a first color film, and the first color film may be between the control circuit and the substrate.

14 Claims, 13 Drawing Sheets

(56) References Cited

U.S. PATENT DOCUMENTS

2016/0141349 A1    5/2016  Yun et al.
2018/0122883 A1    5/2018  Beak et al.
2018/0151842 A1*  5/2018  Park .................... H01L 51/5275

FOREIGN PATENT DOCUMENTS

| CN | 104716157 A |   | 6/2015 | |
|----|---|---|---|---|
| CN | 107293555 A | * | 10/2017 | |
| CN | 107293555 A |   | 10/2017 | |
| EP | 1 122 794 A2 |   | 8/2001 | |
| EP | 3331022 A1 | * | 6/2018 | ......... H01L 51/0097 |
| GB | 2 536 148 A |   | 9/2016 | |

OTHER PUBLICATIONS

Office Action dated Jun. 5, 2020, issued in counterpart CN Application No. 201711326752.7, with English Translation (15 pages).
Office Action dated Oct. 16, 2019, issued in counterpart CN application No. 201711326752.7, with English translation. (15 pages).
Extended (Supplementary) European Search Report dated Aug. 11, 2021, issued in counterpart EP application No. 18857382.8. (6 pages).

* cited by examiner

ORGANIC LIGHT-EMITTING DIODE APPARATUS WITH COLOR FILM SHIELDING LAYER, FABRICATION METHOD THEREOF, DISPLAY PANEL, AND DISPLAY APPARATUS

CROSS-REFERENCE TO RELATED APPLICATIONS

This application claims benefit of the filing date of Chinese Patent Application No. 201711326752.7 filed on Dec. 13, 2017, the disclosure of which is hereby incorporated in its entirety by reference.

TECHNICAL FIELD

This disclosure relates to a display technology, in particular, to an organic light-emitting diode apparatus, a fabrication method thereof a display panel, and a display apparatus.

BACKGROUND

As shown in FIG. 1, a pixel circuit of an Organic Light-Emitting Diode (OLED) generally includes a switch transistor 11, a driving transistor 12, a pixel capacitor 13, a scanning control line 14, a power control line 15, a data control line 16, and an OLED apparatus 17.

BRIEF SUMMARY

Accordingly, one example of the present disclosure is an organic light-emitting diode apparatus. The organic light-emitting diode apparatus may include a substrate and a plurality of pixels on a first side of the substrate. Each of the plurality of pixels may include a display region and a non-display region. The non-display region may be provided with a control circuit and a first color film, and the first color film may be between the control circuit and the substrate.

The organic light-emitting diode apparatus may further include a second color film in the display region. The first color film and the second color film may be arranged in the same layer. The first color film may be made of an opaque organic material. The plurality of pixels may emit light of a plurality of colors, and the first color film may be formed by stacked color films of the plurality of colors.

The organic light-emitting diode apparatus may further include a pixel capacitor made of a transparent conductive material on the first side of the substrate. The pixel capacitor may be in the display region. The control circuit may include a driving transistor and a switch transistor. The pixel capacitor may include a first pixel capacitor electrode plate and a second pixel capacitor electrode plate which may be insulated from each other. The first pixel capacitor electrode plate may be between the second pixel capacitor electrode plate and the substrate, and the first pixel capacitor electrode plate may be respectively coupled with a gate electrode of the driving transistor and a source electrode of the switch transistor.

The organic light-emitting diode apparatus may further include a third electrode plate. The driving transistor may include an active region. The third electrode plate and the active region of the driving transistor may be arranged in the same layer. The third electrode plate and the first pixel capacitor electrode plate may be insulated from each other. The third electrode plate and the second pixel capacitor electrode plate may be electrically coupled. An orthographic projection of the third electrode plate on the substrate may overlap an orthographic projection of the first pixel capacitor electrode plate on the substrate, and an interlayer insulating layer may be arranged between the third electrode plate and the first pixel capacitor electrode plate. An area of the orthographic projection of the third electrode plate on the substrate may be substantially the same as an area of the orthographic projection of the first pixel capacitor electrode plate on the substrate.

The third electrode plate may be arranged only in the non-display region. An interlayer insulating layer may be arranged between the third electrode plate and the first pixel capacitor electrode plate, an insulating layer may be arranged between the first pixel capacitor electrode plate and the second pixel capacitor electrode plate, and the third electrode plate and the second pixel capacitor electrode plate may be electrically coupled through a through hole in the interlayer insulating layer and the insulating layer.

A planarization layer and a buffer layer may be arranged between the first color film and the control circuit, and the planarization layer is arranged closer to the substrate than the buffer layer.

The organic light-emitting diode apparatus may further include a pixel defining layer, a light-emitting layer on a side of the second pixel capacitor electrode plate opposite from the substrate, and a cathode on a side of the light-emitting layer opposite from the substrate.

Another example of the present disclosure is a method of fabricating an organic light-emitting diode apparatus. The method may include forming a first color film in a non-display region of each of a plurality of pixels on a first side of a substrate and forming a control circuit above the first color film of the non-display region.

The method of fabricating an organic light-emitting diode apparatus may further include forming a second color film in a display region of each of the plurality of pixels on the first side of the substrate.

The method of fabricating an organic light-emitting diode apparatus may further include forming a transparent pixel capacitor in the display region. Forming the transparent pixel capacitor may include forming a transparent first pixel capacitor electrode plate in the display region on a side of the second color film opposite from the substrate, forming an insulating layer on the transparent first pixel capacitor electrode plate, and forming a transparent second pixel capacitor electrode plate in the display region on the insulating layer.

The method of fabricating an organic light-emitting diode apparatus may further include forming a planarization layer and a buffer layer between the first color film and the control circuit and forming a third electrode plate on a side of the buffer layer opposite from the substrate. The third electrode plate and the first pixel capacitor electrode plate may be insulated from each other, and the third electrode plate and the second pixel capacitor electrode plate may be electrically coupled.

The method of fabricating an organic light-emitting diode apparatus may further include forming a light-emitting unit on a side of the second pixel capacitor electrode plate opposite from the substrate. The light-emitting unit may include a pixel defining layer, a light-emitting layer, and a cathode on a side of the light-emitting layer opposite from the substrate.

Another example of the present disclosure is a display panel. The display panel may include the organic light-emitting diode apparatus according to one embodiment of the present disclosure.

Another example of the present disclosure is a display apparatus. The display apparatus may include the display panel according to one embodiment of the present disclosure.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the disclosure are apparent from the following detailed description taken in conjunction with the accompanying drawings in which:

DETAILED DESCRIPTION

Figure 1:
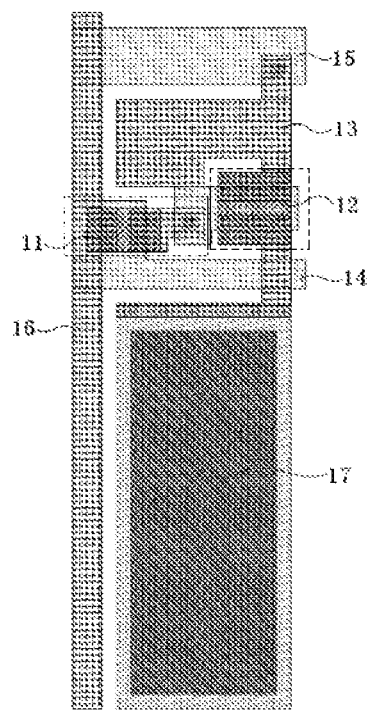
FIG. 1 is a top view of a pixel circuit of an existing OLED.

The present disclosure will be described in further detail with reference to the accompanying drawings and embodiments in order to provide a better understanding by those skilled in the art of the technical solutions of the present disclosure. Throughout the description of the present disclosure, reference is made to FIGS. 1-12. When referring to the figures, like structures and elements shown throughout are indicated with like reference numerals.

In the description of the present disclosure, the meaning of "plural" is two or more unless otherwise specifically and specifically defined.

In the description of the specification, references made to the term "one embodiment," "some example embodiments," and "exemplary embodiments," "example," and "specific example," or "some examples" and the like are intended to refer that specific features and structures, materials or characteristics described in connection with the embodiment or example that are included in at least one embodiment or example of the present disclosure. The schematic expression of the terms does not necessarily refer to the same embodiment or example. Moreover, the specific features, structures, materials or characteristics described may be included in any suitable manner in any one or more embodiments or examples.

In order to reduce influence of ambient light on reliability of thin film transistors (TFTs) of a pixel circuit and to improve display effect, a metal shading layer is normally provided under a pixel circuit of a bottom emission OLED. However, the increased temperature of the metal shading layer can cause an adverse effect on a threshold voltage of a control circuit. In addition, the light shielding layer made of a metal material can generate parasitic capacitance between the light shielding layer and other metal wires of the pixel circuit. As such, a lot of other metal structures need to be avoided in the pixel circuit, thereby increasing design difficulty and impacting open ratio of the pixels.

In addition, a pixel capacitor of a pixel circuit in the conventional art is formed as follows: a drain metal of a driving transistor is extended to serve as an upper electrode plate, and a gate metal of the driving transistor is extended to serve as a lower electrode plate. A gate insulating layer of the driving transistor is used as a dielectric layer of the pixel capacitor. The upper electrode plate and the lower electrode plate of the pixel capacitor are made of opaque metals. As such, the open ratio of the pixels is not high due to this layout design.

Figure 2A:
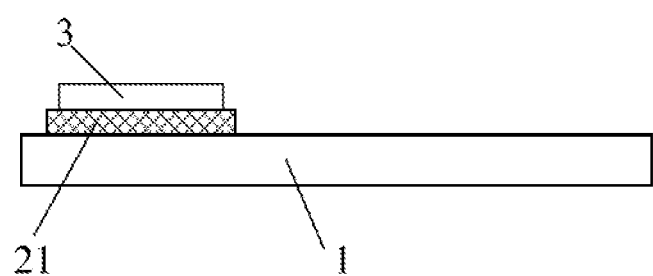
FIG. 2A is a schematic structural diagram of an OLED apparatus according to some embodiments of the present disclosure.
Figure 2B:
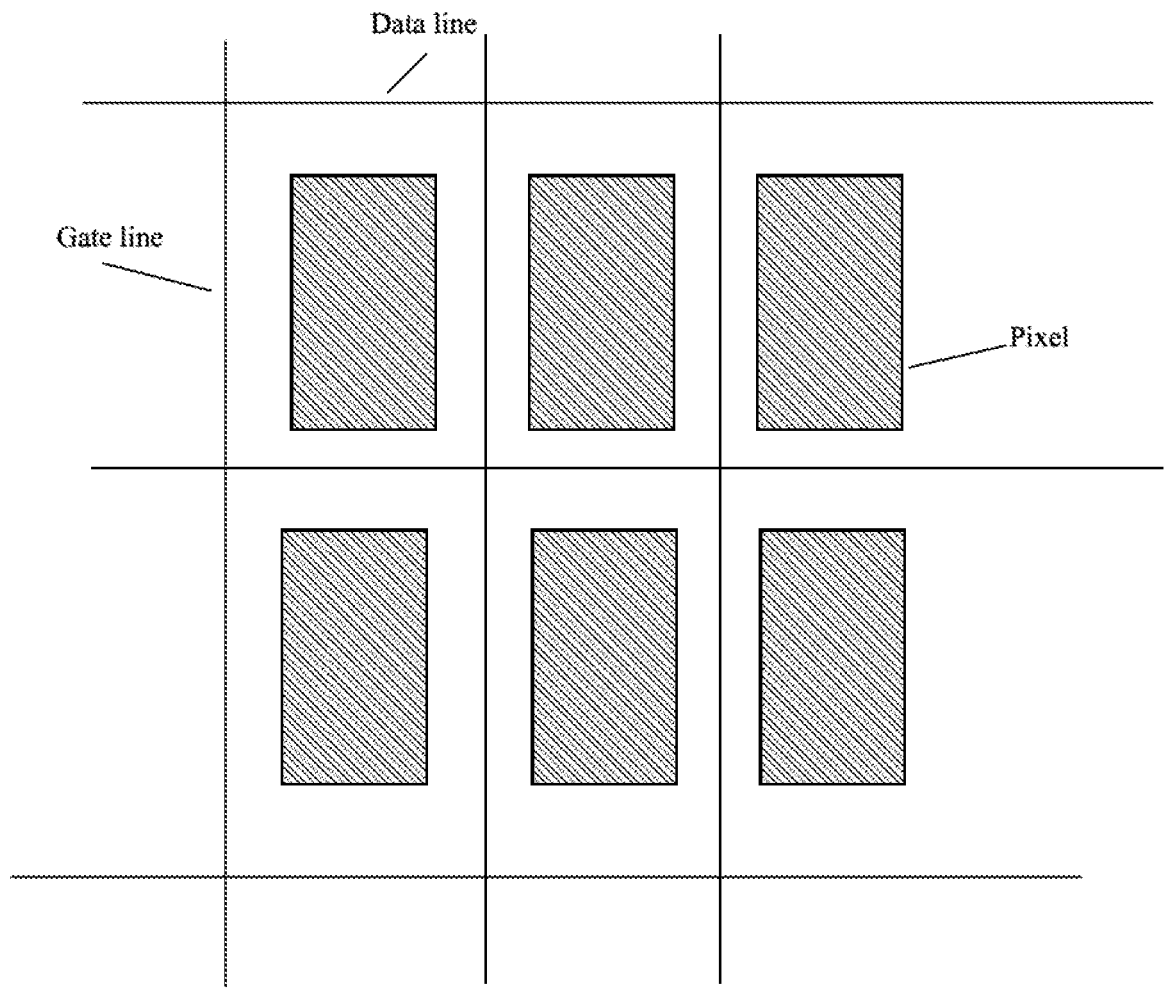
FIG. 2B is a schematic structural diagram of an OLED apparatus according to some embodiments of the present disclosure.

An OLED apparatus is provided according to some embodiments of the present disclosure, as shown in FIGS. 2A and 2B. The OLED apparatus includes a substrate 1, as shown in FIG. 2A. The substrate 1 includes a plurality of pixels, as shown in FIG. 2B. Each of the plurality of the pixels includes a display region and a non-display region corresponding to the display region. A control circuit 3 and a first color film 21 are provided in the non-display region on a first side of the substrate 1. The first color film 21 is arranged between the control circuit 3 and the substrate 1.

In the OLED apparatus of the present embodiments, first, the first color film 21 is formed in the non-display region of each pixel on the substrate 1, so that the first color film 21 can be used as a light shielding layer of the control circuit 3 to block a majority of light. The first color film 21 is usually made of an organic, non-metal material. The first color film 21 is not conductive. As such, even though the first color film 21 is arranged in layers with other metal electrode structures (not shown in the Figure), no parasitic capacitance can be generated, thereby avoiding the impact on the threshold voltage of the control circuit 3 caused by the increasing temperature of a metal light shielding layer. Meanwhile, the first color film 21 serves as the light shielding layer of the control circuit 3 so that wiring design of the control circuit 3 is also facilitated, thereby increasing the open ratio.

Figure 3:
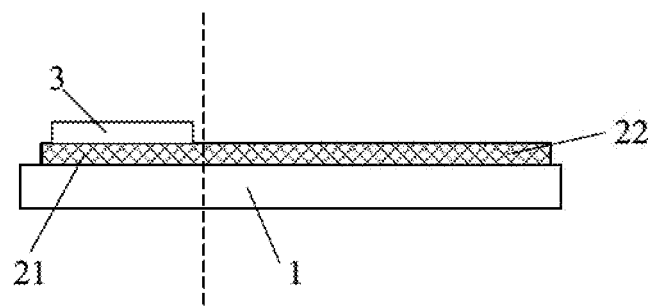
FIG. 3 is a schematic structural diagram of an OLED apparatus according to some embodiments of the present disclosure.

An OLED apparatus is provided according to some embodiments of the present disclosure, as shown in FIGS. 3-1.1. The OLED apparatus includes a substrate 1. The substrate 1 includes a plurality of pixels. Each of the plurality of the pixels includes a display region and a non-display region at an edge of the display region. A control circuit 3 and a first color film 21 are provided in the non-display region on a first side of the substrate 1. The first color film 21 is arranged closer to the substrate 1 than the control circuit 3. The display region on the first side of the substrate 1 is further provided with a second color film 22. The first color film 21 and the second color film 22 are arranged in the same layer.

In the OLED apparatus of the present embodiments, the first color film 21, the second color film 22, the control circuit 3, and the like are arranged on the same side of the substrate 1. A pixel structure is shown in FIG. 3. According to the embodiment as shown in FIG. 3, the first side of the substrate 1 is located above the substrate 1. The left side of the dotted line is the non-display region, and the right side of the dotted line is the display region, which is also referred to as a light-emitting area. The non-display region is provided with a first color film 21 used as a light shielding layer of the control circuit 3. The display region is provided with a second color film 22 used as a light-filtering film for controlling color of exiting light of the pixel. In the conventional art, a control circuit is usually formed in a non-pixel region and, then, a color film is formed in the pixel region. In the present embodiments, the first color film 21 and the second color film 22 are formed first and, then, a control circuit 3 is formed. As such, the second color film 22 and the first color film 21 can be simultaneously formed, thereby saving one step in the process. That is, the first color film and the second color film are formed by the same patterning process.

In some embodiments, the first color film and the second color film in the same pixel are made of the same organic material. Specifically, the first color film and the second color film in the same pixel are made of a color film of any one of colors red, green and blue (or yellow, blue, and purple). In this implementation, the first color film and the second color film can have the same thickness. In the implementation, the first color film can reduce light intensity and block a majority of the light.

In some embodiments, the first color film and the second color film are made of different materials. The first color film is made of an opaque organic material. Specifically, the first color film can be made of an opaque organic material of deep-color. The second color films of different pixels are respectively made of a color film of any one of colors red, green, blue (or yellow, blue and purple). In some embodiments, the first color film and the second color film are of substantially the same thickness.

In some embodiments, the substrate includes pixels of three colors. The second color film of each pixel is made of a color film of any one of the three colors. The first color film of each pixel is made of stacked color films of the three colon.

Specifically, the first color film can be made of layers of color films of three colors red, green, blue (or yellow, blue, purple) arranged in a stacked mode. The second color films of different pixels are respectively made of a color film of any one of the three colors red, green and blue (or yellow, blue, purple). More specifically, each layer of the color film having a color in the first color film is simultaneously formed with the second color film of the same color with a half-tone process, so that the total thickness of the first color film formed by stacking is substantially the same as a thickness of the second color film.

Figure 5:
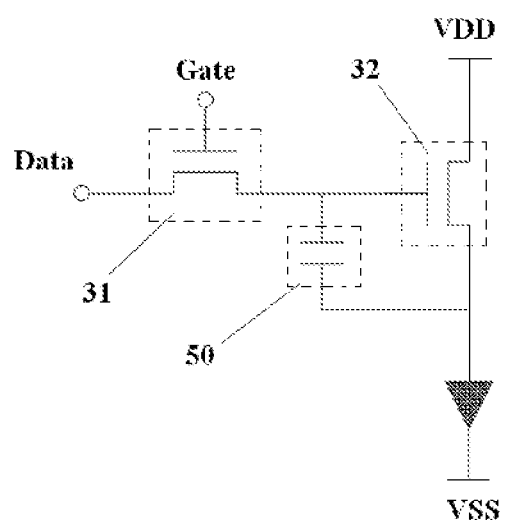
FIG. 5 is a schematic diagram of a control circuit according to some embodiments of the present disclosure.

A connection mode of a control circuit 3 is provided according to some embodiments of the present disclosure, as shown in FIG. 5. Normally, the control circuit 3 includes a driving transistor 32, a switch transistor 31, and a pixel capacitor 50. A gate of the driving transistor 32 and a source electrode of the switch transistor 31 are respectively coupled with the pixel capacitor 50. A gate electrode of the switch transistor 31 is coupled with a gate line. A source electrode of the switch transistor 31 is respectively coupled with a first electrode plate of the pixel capacitor and the gate electrode of the driving transistor 32. A drain electrode of the switch transistor 31 is coupled with a data line. A source electrode of the driving transistor 32 is coupled with VDD. A drain electrode of the driving transistor 32 is coupled with a second electrode plate of the pixel capacitor. It should be noted that FIG. 5 shows a simple control circuit 3. A compensation module and the like can be further included in the control circuit 3, which is not described in detail here.

The first electrode plate of the pixel capacitor and the second electrode plate of the pixel capacitor in conventional art are usually made of a metal material and arranged in the non-display region. In some embodiments of the present disclosure, a transparent pixel capacitor 50 is arranged on a side of the second color film 22 opposite from the substrate 1. The pixel capacitor 50 is arranged in the display region. In some embodiments, the pixel capacitor 50 is made of a transparent conductive material.

Figure 4:
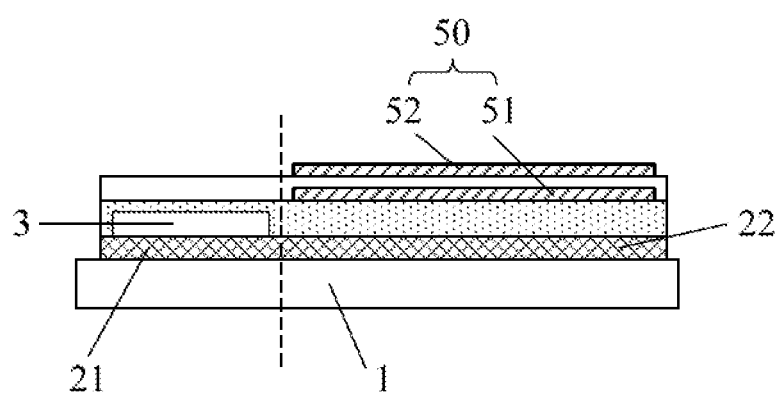
FIG. 4 is a schematic structural diagram of an OLED apparatus according to some embodiments of the present disclosure.

As shown in FIG. 4, a transparent pixel capacitor 50 is arranged above the second color film 22 in a display region on the right side of the dotted line. Since the pixel capacitor 50 is transparent, the pixel capacitor 50 can be arranged in the display region so that the non-display region is not occupied, thereby increasing the open ratio of the pixels. In some embodiments, the pixel capacitor 50 is made of a transparent conductive material. More specifically, the pixel capacitor 50 can be made of indium tin oxide (ITO) or other materials, or also can be made of a metallic conductive material with high transparency.

Also shown in FIG. 4, the pixel capacitor 50 includes a first pixel capacitor electrode plate 51 and a second pixel capacitor electrode plate 52 which are insulated from each other. The first pixel capacitor electrode plate 51 is arranged closer to the substrate 1 than the second pixel capacitor electrode plate 52.

Figure 6:
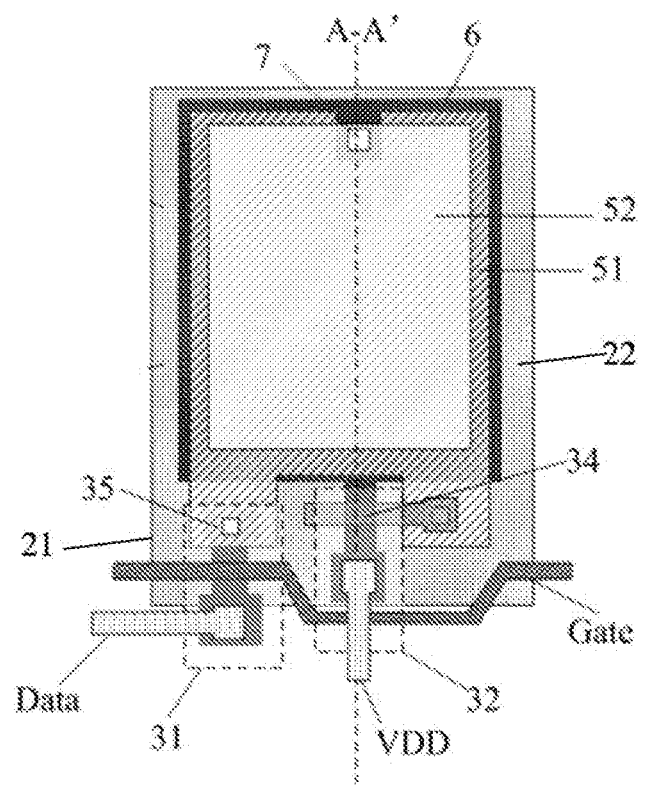
FIG. 6 is a schematic top view of an OLED apparatus according to some embodiments of the present disclosure.
Figure 7:
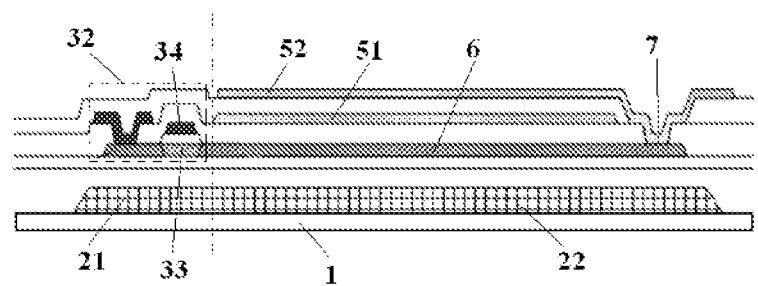
FIG. 7 is a schematic cross-sectional view of an OLED apparatus according to some embodiments of the present disclosure.

FIG. 6 is a schematic structural diagram of an OLED apparatus according to some embodiments of the present disclosure. FIG. 7 is a schematic cross-sectional view of the OLED apparatus along line A-A' shown in FIG. 6. As shown in FIG. 6 and FIG. 7, the organic light-emitting diode apparatus further includes a third electrode plate 6. The third electrode plate 6 is arranged on a side of the first pixel capacitor electrode plate 51 facing the substrate 1. The third electrode plate 6 and the first pixel capacitor electrode plate 51 are insulated from each other. In addition, the third electrode plate 6 is electrically coupled with the second pixel capacitor electrode plate 52. The source electrode 35 of the switch transistor 31 is coupled to the first pixel capacitor electrode plate 51. The drain electrode of the switch transistor 31 is coupled to a data line. The source electrode of the driving transistor 32 is coupled to VDD. The gate electrode 34 of the driving transistor 32 is coupled to the first pixel capacitor electrode plate 51.

As shown in FIG. 6, the third electrode plate 6 is arranged below the first pixel capacitor electrode plate 51. The function of the third electrode plate 6 is as follows. The third electrode plate 6 is electrically coupled with the second pixel capacitor electrode plate 52 so that a layered capacitor structure is formed, thereby increasing the capacitance. In one embodiment, the third electrode plate 6 can cover the display region, and the area of the third electrode plate 6 can be the same as that of the first pixel capacitor electrode plate 51. In another embodiment, the second pixel capacitor electrode plate 51 is arranged at a part of the display region, that is, the area of the third electrode plate 6 is smaller than that of the first pixel capacitor electrode plate 51. In another embodiment, the area of the third electrode plate 6 is larger than that of the first pixel capacitor electrode plate 51, that is, the third electrode plate 6 is arranged in both the display region and the non-display region.

In some embodiments as shown in FIG. 7, the driving transistor 32 includes an active region 33. The third electrode plate 6 is formed in the same layer as the active region 33 of the driving transistor 32.

An oxide material such as a-indium gallium zinc oxide (IGZO), ZnON, indium zinc tin oxide (IZTO), a-Si, p-Si, hexathiophene, or polythiophene can be used to form an whole active layer in the display region and the non-display region. The oxide material in the non-display region serves as the semiconductor of the transistor. A conductive processing is performed on the active layer of the display region, so that the active layer in the display region serves as the third electrode plate 6. Such a design not only forms a structure of a layered capacitor as mentioned above and accordingly increases the capacitance, but also reduces the process by one step, thereby decreasing the cost.

In some embodiments, an interlayer insulating layer 53 is arranged between the third electrode plate 6 and the first pixel capacitor electrode plate 51. An insulating layer 54 is arranged between the first pixel capacitor electrode plate 51 and the second pixel capacitor electrode plate 52. The third electrode plate 6 and the second pixel capacitor electrode plate 52 are electrically coupled through a through hole 7 in the interlayer insulating layer 53 and the insulating layer 54.

In some embodiments, the insulating layer 54 is arranged between the first pixel capacitor electrode plate 51 and the second pixel capacitor electrode plate 52, so that the first pixel capacitor electrode plate 51 and the second pixel capacitor electrode plate 52 are insulated from each other. In addition, as shown in FIGS. 6 and 7, a specific connection mode using a through hole 7 is provided to electrically couple the third electrode plate 6 and the second pixel capacitor electrode plate 52.

Figure 8:
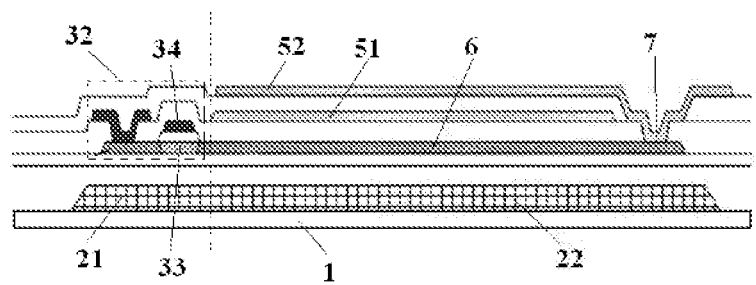
FIG. 8 is a schematic cross-sectional view an OLED apparatus according to some embodiments of the present disclosure.

In some embodiments, as shown in FIG. 8, a planarization layer 55 and a buffer layer 56 are arranged between the first color film 21 and the control circuit 3. The planarization layer 55 is arranged closer to the substrate 1 than the buffer layer 56. The OLED apparatus further includes a pixel defining layer 43 and a light emitting layer 41 arranged on a side of the second pixel capacitor electrode plate 52 opposite from the substrate 1. A cathode 42 is arranged on a side of the light-emitting layer 41 opposite from the substrate 1.

Generally, a light-emitting unit includes a cathode 42, an anode, and a light-emitting layer 41 disposed between the cathode 42 and the anode. As shown in FIG. 8, the second pixel capacitor electrode plate 52 arranged in the display region is used as an anode at the same time. That is, the light-emitting layer 41 and the cathode 42 can be directly arranged on the second pixel capacitor electrode plate 52. As such, the metal shading layer and the pixel capacitor 50 do not need to be arranged in the non-display region. Since the pixel capacitor 50 is arranged in the display region, the difference in height between the light-emitting layer 41 and the control circuit 3 in the longitudinal direction is reduced, thereby effectively reducing Vth drift of the apparatus caused by the metal inside the panel reflecting light emitted by the light-emitting layer 41 and improving characteristics of Negative Bias Temperature Illumination Stress (NBTIS) of the back plate. In addition, compared with the conventional art, that the second pixel capacitor electrode plate 52 is used as the anode means that only a first pixel capacitor electrode plate 51 is additionally arranged in the display region. Furthermore, a third electrode plate 6 and a interlayer insulating layer 53 arranged between the third electrode plate 6 and the first pixel capacitor electrode plate 51 are correspondingly added. The current embodiment is a bottom emission display mode, which further improves light emitting efficiency.

Figure 9:
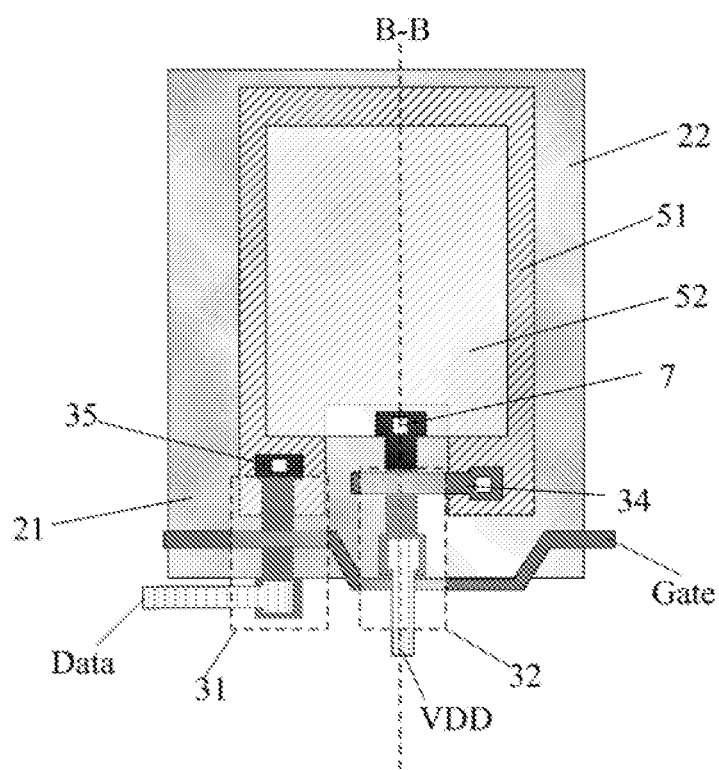
FIG. 9 is a schematic top view of an OLED apparatus according to some embodiments of the present disclosure.
Figure 10:
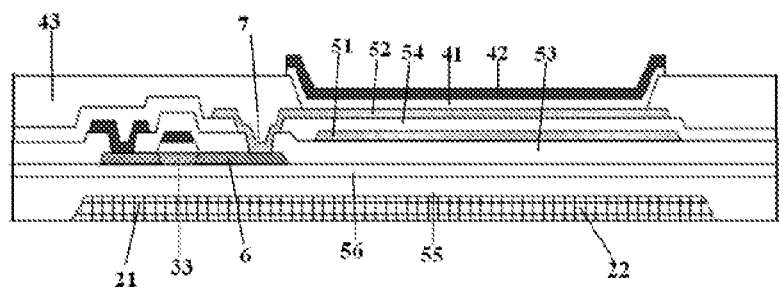
FIG. 10 is a schematic cross-sectional view of an OLED apparatus according to some embodiments of the present disclosure.

FIG. 9 is a schematic structural diagram of an OLED apparatus according to some embodiments of the present disclosure. FIG. 10 is a schematic cross-sectional view of the OLED apparatus along line B-B' shown in FIG. 9. As shown in FIGS. 9 and 10, a through hole 7 is formed in the non-display region closer to the driving transistor 32. The third electrode plate 6 is arranged in the non-display region.

In the embodiment shown in FIG. 10, the area of the third electrode plate 6 in the display region is reduced, and the third electrode plate 6 is only arranged in the non-display region. That is, an orthographic projection of the third electrode plate 6 on the substrate 1 does not overlap an orthographic projection of the first pixel capacitor electrode plate 51 on the substrate 1. A pixel capacitor is formed by the two ITO layers of the first pixel capacitor electrode plate 51 and the second pixel capacitor electrode plate 52. The advantage of the present embodiment is that the third electrode plate 6 is prevented from absorbing the light emitted by the light-emitting layer 41, thereby improving the light-emitting efficiency.

Figure 11:
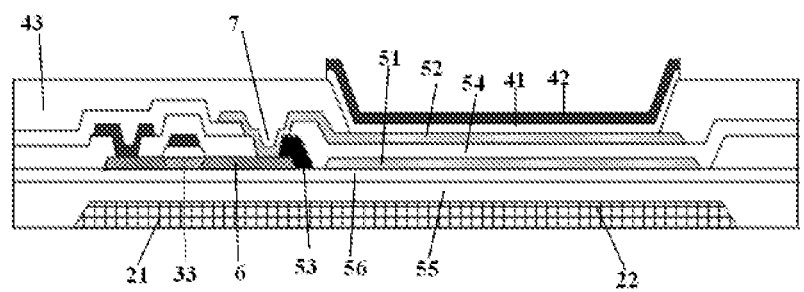
FIG. 11 is a schematic cross-sectional view of an OLED apparatus according to some embodiments of the present disclosure.
Figure 12:
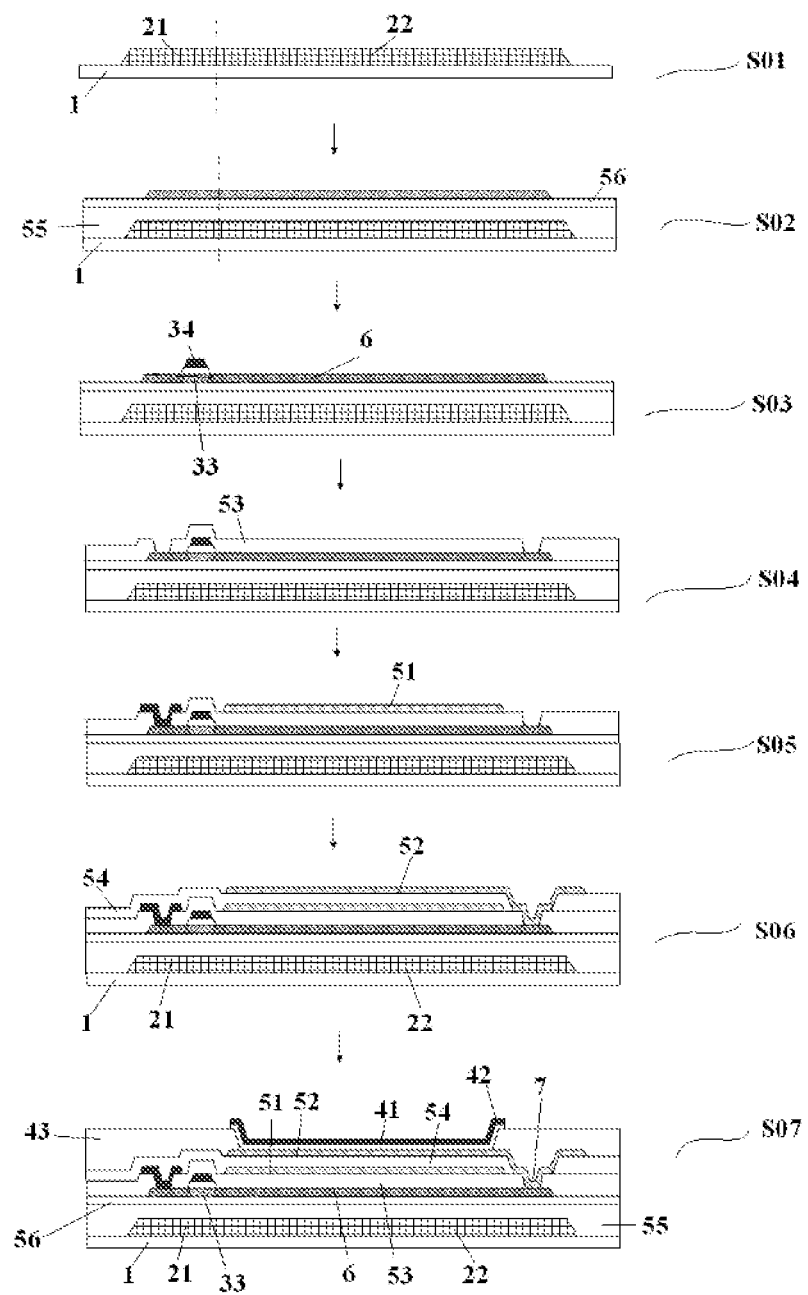
FIG. 12 is a schematic flow chart of a method of fabricating an OLED apparatus according to some example embodiments of the present disclosure.

In some e embodiments, as shown in FIG. 11, an orthographic projection of the interlayer insulating layer 53 on the substrate 1 does not overlap an orthographic projection of the first pixel capacitive plate 51 on the substrate 1.

FIG. 11 is a schematic structural diagram of an OLED apparatus according to some embodiments of the present disclosure. As shown in FIG. 11, the interlayer insulating layer 53 is arranged only in the non-display region, and no interlay insulating layer 53 is formed in the display region. As such, the number of layers that light needs to penetrate through is reduced, thereby further improving the light emitting efficiency. In some embodiments, during the process of etching the interlayer insulating layer 53, the insulating layer 53 in the display region is etched away, and only the interlayer insulating layer 53 in the non-display region is kept.

The size, thickness, and the like of structural layers in the figures are only for illustration. In the implementation process, an area of the projection of each structural layer on the substrate can be the same, or can also be different from each other. It is not enumerated herein. The area of the projection of each of the required structural layers can be obtained through an etching process. Furthermore, the geometrical shape of each structural layer is not limited by the structure shown in the figures. For example, the geometrical shape of each structural layer can be a rectangle as shown in the figures, or can also be in a trapezoid shape, or other shapes which can be formed by etching.

A method of fabricating an OLED apparatus, as shown in FIG. 11, is provided according to some embodiments of the present disclosure. The method includes the following steps:

In step S01, a layer of a color film is formed on a substrate 1. The substrate 1 can be a glass substrate 1. A plurality of pixels is arranged on the substrate 1. Each pixel includes a display region and a non-display region corresponding to the display region. In some embodiments, the step includes the following. First, the glass substrate 1 is cleaned, and then a layer of color film respectively corresponding to colors R, G, B of each of the pixels is sequentially fabricated on the glass substrate. The layer of color film in each pixel covers the display region and the non-display region. The layer of color film in the display region is the second color film 22. The second color film 22 is a light filtering film used for controlling color of light emitted from the pixel. In one embodiment, the second color film in the display region includes one layer of color film, which may correspond to one of colors R, G, and B of each of the pixels. The color film layer in the non-display region is the first color film 21, and the first color film 21 can block most of the light and serve as a light shielding layer of the control circuit 3. The first color film in the non-display region may include one or more layers of color films respectively corresponding to colors R, G, and B of each of the pixels.

In some embodiments, in step S02a, a polysiloxane, acrylic, or polyimide material is spin-coated on the color film layer, and then dried to form a planarization layer 55. In some embodiments, in step S02b, an insulating material such as SiOx or SiNx is deposited using plasma-enhanced chemical vapor deposition (PECVD) at a low temperature on the planarization layer 55 to form a buffer layer 56. In step S02c, a pattern including an active region 33 and a pre-structure of a third electrode plate is formed on a surface of the buffer layer 56 opposite from the substrate 1.

In this embodiment, the active region 33 and the third electrode plate are formed in the same layer as an example for illustration purpose. When the active region 33 and the third electrode plate are formed in the same layer in the embodiment, the pattern including the active region 33 and the pre-structure of the third electrode plate is made of an oxide material, such as a-IGZO, ZnON, IZTO, a-Si, p-Si, hexthiophene, polythiophene or the like. The active region 33 and the third electrode plate can also be formed separately. In this case, the material of the active region can be selected according to specific need and is not limited herein.

In step S03a, a gate insulating layer is formed on the substrate after the above steps are completed. The material of the gate insulating layer includes, but is not limited to, SiOx, SiNx, SiON and other dielectric materials. The gate insulating layer can also be made of an organic insulating material or a material of a high dielectric constant such as AlOx, HfOx, TaOx and the like. In step S03b, a pattern including a gate 34 is formed on the substrate after the above steps are completed. In step S03c, a conductive treatment is performed on the pre-structure of the third electrode plate to form a third electrode plate 6.

In step S04, an interlayer insulating layer 53 and a through hole are formed on the substrate after the above steps are completed. The material of the interlayer insulating layer 53 can be, but is not limited to, SiOx, SiNx, SiON or other dielectric materials. It can also be made of an organic insulating material or a material of a high dielectric constant such as AlOx, HfOx, TaOx and the like.

In step S05a, a pattern including a source electrode and a drain electrode is formed on the substrate after the above steps are completed. The source electrode and the drain electrode can be made of a common metal material, such as Ag, Cu, Al and Mo. It can also be made of a plurality of layers of metal material (e.g., three layers of MoNb/Cu/MoNb). It can also be an alloy of the metals such as AlNd, MoNb or the like. In addition, it can also be a stacked structure formed by a metal and transparent conductive oxides such as ITO, AZO and the like. The stacked structure may be ITO/Ag/ITO. In step S05b, an indium tin oxide (ITO) material is deposited and a wet etching is performed to form a patterned ITO in the display region. Then, the first pixel capacitor electrode plate 51 is respectively coupled with the gate electrode of the driving transistor 32 and the source electrode of the switch transistor 31.

In step S06a, an insulating layer 54 and a through hole are formed on the substrate after the above steps are completed. In step S06b, a transparent second pixel capacitor electrode plate 52 is formed in the display region on the substrate after the above steps are completed. The second pixel capacitor electrode plate 52 and the third electrode plate 6 are electrically coupled through the through hole in the interlayer insulating layer 53 and the insulating layer 54.

In step S07a, after the above steps are completed, a patterned pixel defining layer 43 is formed on the substrate to define a light-emitting region. In step S07b, a material of the light-emitting layer 41 is vapor deposited. In some embodiments, the light-emitting layer 41 includes a multilayer structure. For example, the light-emitting layer 41 can include a hole injection layer (HIL), a hole transport layer (HTL), an organic light-emitting material layer (EML), an electron transport layer (ETL), and an electron injection layer (EIL). In step S07c, a cathode layer 42 is formed. The cathode layer 42 is usually made of a metal material having low work function such as lithium, magnesium, calcium, strontium, aluminum, indium and the like or alloys of the metals as mentioned above with copper, gold or silver. Alternatively, it can also be formed by a thin buffer insulating layer (such as lithium fluoride LiF, strontium carbonate CsCO3 and the like) together with the metal or the alloy mentioned above.

A display panel is provided according to some embodiments of the present disclosure. The display panel includes the OLED apparatus according to one embodiment of the present disclosure.

A display apparatus is provided according to some embodiments of the present disclosure. The display apparatus includes the display panel according to one embodiment of the present disclosure. The display apparatus can be an electronic paper, an OLED panel, a mobile phone, a tablet computer, a television, a display, a notebook computer, a digital photo frame, a navigator or other products or components with a display function.

The principle and the embodiment of the disclosures are set forth in the specification. The description of the embodiments of the present disclosure is used only to help understand the method of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

DESCRIPTION OF SYMBOLS IN THE DRAWINGS

1: substrate
21: first color film,
22: second color film
3: control circuit
31: switch transistor
32: driving transistor
33: active region
34: gate electrode
35: source electrode
41: light-emitting layer
42: cathode 43: pixel defining layer
50: pixel capacitor
51: first pixel capacitor electrode plate
52: second pixel capacitor electrode plate
53: interlayer insulating layer
54: insulating layer
55: planarization layer
56: buffer layer
6: third electrode plate
7: through hole

What is claimed is:

1. An organic light-emitting diode apparatus, comprising:
a substrate; and
a plurality of pixels on a first side of the substrate, each of the plurality of pixels including a display region and a non-display region;
wherein the non-display region is provided with a control circuit and a first color film, and the first color film is between the control circuit and the substrate;
the organic light-emitting diode apparatus further includes a pixel capacitor made of a transparent conductive material on the first side of the substrate, and the pixel capacitor is in the display region;
the control circuit comprises a driving transistor and a switch transistor, the pixel capacitor comprises a first pixel capacitor electrode plate and a second pixel capacitor electrode plate which are insulated from each other, the first pixel capacitor electrode plate is between the second pixel capacitor electrode plate and the substrate, and the first pixel capacitor electrode plate is respectively coupled with a gate electrode of the driving transistor and a source electrode of the switch transistor;
the organic light-emitting apparatus further includes a third electrode plate, the driving transistor comprises an active region, the third electrode plate and the active region of the driving transistor are arranged in the same layer, the third electrode plate and the first pixel capacitor electrode plate are insulated from each other, and the third electrode plate and the second pixel capacitor electrode plate are electrically coupled; and
an orthographic projection of the third electrode plate on the substrate overlaps an orthographic projection of the first pixel capacitor electrode plate on the substrate, and an interlayer insulating layer is arranged between the third electrode plate and the first pixel capacitor electrode plate.

2. The organic light-emitting apparatus according to claim 1, further comprising:
a second color film in the display region,
wherein the first color film and the second color film are arranged in the same layer.

3. The organic light-emitting apparatus according to claim 1, wherein the first color film is made of an opaque organic material.

4. The organic light-emitting apparatus according to claim 1, wherein the plurality of pixels emits light of a plurality of colors, the first color film is formed by stacked color films of the plurality of colors.

5. The organic light-emitting apparatus according to claim 1, wherein an area of the orthographic projection of the third electrode plate on the substrate is substantially the same as an area of the orthographic projection of the first pixel capacitor electrode plate on the substrate.

6. The organic light-emitting apparatus according to claim 1, wherein the third electrode plate is arranged only in the non-display region.

7. The organic light-emitting apparatus according to claim 1, wherein an interlayer insulating layer is arranged between the third electrode plate and the first pixel capacitor electrode plate, an insulating layer is arranged between the first pixel capacitor electrode plate and the second pixel capacitor electrode plate, and the third electrode plate and the second pixel capacitor electrode plate are electrically coupled through a through hole in the interlayer insulating layer and the insulating layer.

8. The organic light-emitting apparatus according to claim 1, wherein a planarization layer and a buffer layer are arranged between the first color film and the control circuit, and the planarization layer is arranged closer to the substrate than the buffer layer.

9. The organic light-emitting apparatus according to claim 1, further comprising a pixel defining layer, a light-emitting layer on a side of the second pixel capacitor electrode plate opposite from the substrate, and a cathode on a side of the light-emitting layer opposite from the substrate.

10. A display panel comprising the organic light-emitting diode apparatus according to claim 1.

11. A display apparatus comprising the display panel of claim 10.

12. A method of fabricating an organic light-emitting diode apparatus, comprising:
forming a first color film in a non-display region of each of a plurality of pixels on a first side of a substrate; and
forming a control circuit above the first color film of the non-display region;
wherein the method further includes:
forming a transparent pixel capacitor in the display region,
wherein forming the transparent pixel capacitor comprises:
forming a transparent first pixel capacitor electrode plate in the display region on a side of the second color film opposite from the substrate;
forming an insulating layer on the transparent first pixel capacitor electrode plate; and
forming a transparent second pixel capacitor electrode plate in the display region on the insulating layer;
wherein the method further includes:
forming a planarization layer and a buffer layer between the first color film and the control circuit, and
forming a third electrode plate on a side of the buffer layer opposite from the substrate,
wherein the third electrode plate and the first pixel capacitor electrode plate are insulated from each other, and the third electrode plate and the second pixel capacitor electrode plate are electrically coupled; and
an orthographic projection of the third electrode plate on the substrate overlaps an orthographic projection of the first pixel capacitor electrode plate on the substrate, and an interlayer insulating layer is arranged between the third electrode plate and the first pixel capacitor electrode plate.

13. The method of fabricating an organic light-emitting diode apparatus according to claim 12, further comprising:
forming a second color film in a display region of each of the plurality of pixels on the first side of the substrate.

14. The method of fabricating an organic light-emitting diode apparatus according to claim 12, further comprising:
forming a light-emitting unit on a side of the second pixel capacitor electrode plate opposite from the substrate, wherein the light-emitting unit comprises a pixel defining layer, a light-emitting layer, and a cathode on a side of the light-emitting layer opposite from the substrate.

* * * * *